United States Patent
Liu et al.

(10) Patent No.: US 12,174,507 B2
(45) Date of Patent: Dec. 24, 2024

(54) FLEXIBLE VARIABLE EMISSIVITY ELECTROCHROMIC DEVICE AND PREPARATION METHOD

(71) Applicant: NATIONAL UNIVERSITY OF DEFENSE TECHNOLOGY, Changsha (CN)

(72) Inventors: Dongqing Liu, Changsha (CN); Mingyang Li, Changsha (CN); Haifeng Cheng, Changsha (CN); Liang Peng, Changsha (CN); Renfu Peng, Changsha (CN)

(73) Assignee: NATIONAL UNIVERSITY OF DEFENSE TECHNOLOGY, Changsha (CN)

( * ) Notice: Subject to any disclaimer, the term of this patent is extended or adjusted under 35 U.S.C. 154(b) by 763 days.

(21) Appl. No.: 17/418,870

(22) PCT Filed: Oct. 28, 2020

(86) PCT No.: PCT/CN2020/124386
§ 371 (c)(1),
(2) Date: Jun. 28, 2021

(87) PCT Pub. No.: WO2021/139330
PCT Pub. Date: Jul. 15, 2021

(65) Prior Publication Data
US 2022/0075236 A1    Mar. 10, 2022

(30) Foreign Application Priority Data
Jan. 7, 2020   (CN) .......................... 202010012597.7

(51) Int. Cl.
*G02F 1/155*   (2006.01)
*C23C 14/02*   (2006.01)
(Continued)

(52) U.S. Cl.
CPC .............. *G02F 1/155* (2013.01); *C23C 14/02* (2013.01); *C23C 14/025* (2013.01); *F41H 3/02* (2013.01);
(Continued)

(58) Field of Classification Search
CPC ............................................. G02F 1/00–1/397
See application file for complete search history.

(56) References Cited

U.S. PATENT DOCUMENTS 6,798,554 B2 * 9/2004 Hourquebie ............ G02F 1/153
359/267
2018/0088426 A1 * 3/2018 Posset ...................... G02F 1/15

FOREIGN PATENT DOCUMENTS

CN   104932168 A  *  9/2015  ............... G02F 1/15
CN   110184576 A  *  8/2019  ......... C23C 14/0036
(Continued)

OTHER PUBLICATIONS

Machine translation of CN110184576. Retrieved Mar. 29, 2024.*
Machine translation of CN104932168. Retrieved Mar. 29, 2024.*

*Primary Examiner* — Prashant J Khatri
(74) *Attorney, Agent, or Firm* — Bayramoglu Law Offices LLC

(57) ABSTRACT

A flexible variable emissivity electrochromic device and a preparation method thereof are disclosed. The device includes a working electrode, a gel electrolyte layer, and a counter electrode sequentially from top to bottom. The working electrode includes a flexible polymer film and a metal film, the flexible polymer film is a surface-modified film and/or a film with a transition layer plated on a lower side thereof, and the metal film is deposited on the surface-modified film or the transition layer. The electrolyte layer includes a porous membrane and an electrolyte. The electrolyte is infiltrated in the porous membrane. The electrolyte includes an electrochromic material containing metal ions (Continued)

and a solvent, the metal ions enable reversible electrodeposition and dissolution, and metal of the metal ions is different from that used in the metal film. The preparation method includes preparing and assembling a working electrode, a gel electrolyte layer and a counter electrode.

11 Claims, 5 Drawing Sheets

(51) Int. Cl.
  *C23C 14/30* (2006.01)
  *F41H 3/02* (2006.01)
  *G02F 1/1343* (2006.01)
  *G02F 1/1506* (2019.01)

(52) U.S. Cl.
  CPC ........ *G02F 1/13439* (2013.01); *G02F 1/1506* (2013.01); *C23C 14/30* (2013.01); *G02F 2001/1555* (2013.01); *G02F 2203/11* (2013.01); *G02F 2203/48* (2013.01)

(56) References Cited

FOREIGN PATENT DOCUMENTS

| EP | 2972573 B1 | * | 6/2019 | ............. G02F 1/155 |
| WO | WO-02097519 A2 | * | 12/2002 | ............... B64G 1/50 |

* cited by examiner

FLEXIBLE VARIABLE EMISSIVITY ELECTROCHROMIC DEVICE AND PREPARATION METHOD

CROSS REFERENCE TO THE RELATED APPLICATIONS

This application is the national phase entry of International Application No. PCT/CN2020/124386, filed on Oct. 28, 2020, which is based upon and claims priority to Chinese Patent Application No. 202010012597.7, filed on Jan. 7, 2020, the entire contents of which are incorporated herein by reference.

TECHNICAL FIELD

The present invention relates to the technical field of variable emissivity electrochromic devices, and in particular to a flexible variable emissivity electrochromic device and a preparation method thereof.

BACKGROUND

With the rapid development of photoelectric science and technology, military camouflage targets are faced with the threat of visible light, infrared, radar, and other multi-band monitoring and reconnaissance. Infrared imaging technology is widely used in the military field due to its advantages such as excellent concealment, long night vision distance, strong anti jamming capability, and wide applicability, which poses a serious threat to military targets. Based on a thermal infrared adaptive camouflage technology, it is an effective means to deal with thermal infrared detection by eliminating, reducing, changing, or simulating the difference in radiation characteristics between a target and a background in two atmospheric windows (3 to 5 μm and 7.5 to 13 μm, respectively) of thermal infrared.

According to the Steffan-Boltzmann law, the thermal infrared adaptive camouflage technology may be divided into a surface-temperature-control and a surface-emissivity-control based thermal infrared adaptive camouflage technology. The surface-temperature-control based thermal infrared adaptive camouflage technology mainly includes a manner of directly heating and cooling the surface of an object by thermoelectric materials and a manner of controlling the temperature of the surface of an object by injecting liquid of different temperatures into a microfluidic system. The surface-emissivity-control based thermal infrared adaptive camouflage technology mainly changes emissivity by ion embedded/de-embedded oxides, ion-doped conducting polymers, ion-doped multilayer graphene or temperature-control material phase change. However, there are various curved surfaces or places that need to be bent on general military equipment or military personnel who need to be camouflaged. Therefore, the development of a flexible thermal infrared adaptive camouflage technology can expand its application range and improve the camouflage effect of military targets.

The existing thermal infrared adaptive camouflage technologies are either difficult to achieve flexibility or have limited infrared modulation ability under flexible conditions.

SUMMARY

The present invention provides a flexible variable emissivity electrochromic device and a preparation method thereof, to overcome the defects in the prior art such as difficult compatibility between flexibility and strong infrared modulation ability, and realize that the device has a higher infrared emissivity control range in two atmospheric windows (3 to 5 μm and 7.5 to 13 μm) of middle and far infrared bands under flexible conditions.

In order to achieve the above objective, the present invention provides a flexible variable emissivity electrochromic device, including a working electrode, a gel electrolyte layer, and a counter electrode sequentially from top to bottom;

the working electrode includes a flexible polymer film and a metal film, the flexible polymer film is a surface-modified film and/or a film with a transition layer plated on a lower side thereof, the metal film is deposited on the surface-modified film or the transition layer; and the electrolyte layer includes a porous membrane and an electrolyte, the electrolyte is infiltrated in the porous membrane; the electrolyte includes an electrochromic material containing metal ions and a solvent, the metal ions enable reversible electrodeposition and dissolution, and a metal of the metal ions is different from that used in the metal film.

In order to achieve the above objective, the present invention further provides a preparation method of a flexible variable emissivity electrochromic device, including the following steps:

S1: surface-modifying a flexible polymer film and/or plating a transition layer on one side of the film;

S2: depositing a metal film on one side of the surface-modified flexible polymer film, to obtain a working electrode;

or depositing a metal film on the transition layer side of the flexible polymer film or the surface-modified flexible polymer film, to obtain a working electrode;

S3: preparing a gel electrolyte, and infiltrating a porous membrane with the gel electrolyte to obtain a gel electrolyte layer;

S4: directly depositing a conductive layer on one side of the substrate, to obtain a counter electrode; and S5: superimposing one side of the working electrode obtained in S2 deposited with the metal film on one side of the gel electrolyte layer obtained in S3, superimposing one side of the counter electrode obtained in S4 deposited with the conductive layer on the other side of the gel electrolyte layer obtained in S3, and sealing edges of the superimposed structure to obtain the variable emissivity electrochromic device based on metal electrodeposition.

Compared with the prior art, the present invention has the following advantages:

1. The working principle of the flexible variable emissivity electrochromic device provided in the present invention is as follows: the electrochromic material containing metal ions in the gel electrolyte layer makes the metal ions in the electrochromic material be reduced to a metal element and deposited on the surface of the metal film of the working electrode when a negative deposition voltage (−2.0 to −3.0 V) is applied to the working electrode of the device, so as to form a metallic film to convert a spectral part absorbed by plasma infrared absorption and a spectral part penetrated by infrared of the working electrode into infrared reflection, so that the device changes from a high emission state to a low emission state. In addition, by applying a positive dissolution voltage (0.2 to 1.5 V) to the working electrode, the metallic film deposited on the surface of the metal film of the working electrode can be dissolved quickly, thus the device can return to the high emission state.

According to the device provided in the present invention, the metal film enables the sum of an absorbed part and a part penetrated by infrared radiation in the working electrode accounts for more than 50% of the total spectral response of the working electrode within this band. Moreover, the device has a substantially high infrared emissivity control range in two atmospheric windows (3 to 5 μm and 7.5 to 13 μm) of middle and far infrared bands, and all emissivity variations can reach 0.5. Additionally, due to the high transparency of the flexible polymer film in the whole infrared band, the device has emissivity control of about 0.5 in the whole band of 2.5 to 25 The transition layer is configured to improve the cyclic stability of the device. The flexible polymer film acts as a substrate for support, the metal film conducts electricity, and the transition layer bonds the polymer film and the metal film. Meanwhile, since the stability and firmness of the working electrode of the metal film are improved, the uniformity and cyclic stability of the device are improved, so that the device can achieve higher uniformity of infrared emissivity variation. Moreover, the flexible polymer film is used as a substrate to replace an existing rigid substrate in the working electrode of the device, so that the device has better flexibility and can be used in a wider range.

2. The preparation method of the flexible variable emissivity electrochromic device provided in the present invention has a simple process and a short preparation cycle, which can be used for industrial production.

BRIEF DESCRIPTION OF THE DRAWINGS

In order to describe the technical solutions in the embodiments of the present invention or in the prior art more clearly, accompanying drawings to be used for describing the embodiments or the prior art are introduced briefly below. Apparently, the drawings in the following description represent merely some embodiments of the present invention. Those of ordinary skill in the art may also obtain other drawings based on structures shown in the drawings without making any creative effort.

Figure 1:
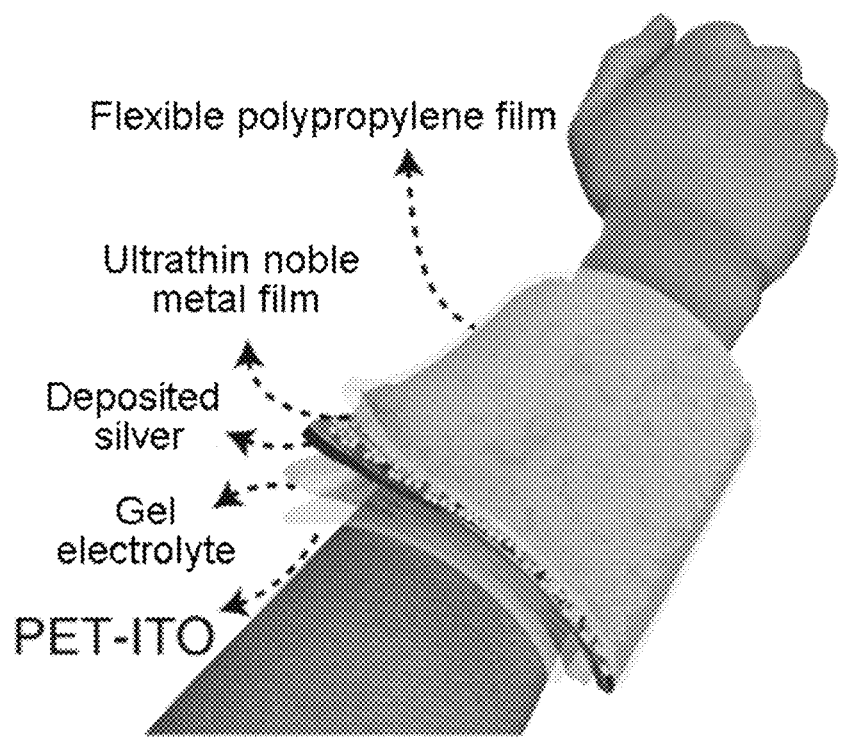
FIG. 1 is a structural diagram of a flexible variable emissivity electrochromic device according to Embodiment 1.

Achievement of the objective, functional characteristics, and advantages of the present invention will further be described in combination with embodiments and with reference to the drawings.

DETAILED DESCRIPTION OF THE EMBODIMENTS

The following clearly and completely describes the technical solutions in the embodiments of the present invention with reference to the drawings in the embodiments of the present invention. Apparently, the described embodiments are a part rather than all of the embodiments of the present invention. All other embodiments obtained by those of ordinary skill in the art based on the embodiments of the present invention without creative efforts shall fall within the protection scope of the present invention.

In addition, the technical solutions between the embodiments of the present invention can be combined with each other, but they must be on the basis that those skilled in the art can achieve it. When the combinations of the technical solutions appear contradictory or cannot be achieved, it should be considered that the combination of the technical solutions does not exist and does not fall within the protection scope claimed by the present invention.

Without special instructions, drugs/reagents used are all commercially available.

The present invention provides a flexible variable emissivity electrochromic device, including a working electrode, a gel electrolyte layer, and a counter electrode sequentially from top to bottom.

The working electrode includes a flexible polymer film and a metal film, the flexible polymer film is a surface-modified film and/or a film with a transition layer plated on a lower side thereof, and the metal film is deposited on the surface-modified film or the transition layer.

The electrolyte layer includes a porous membrane and an electrolyte, and the electrolyte is infiltrated in the porous membrane. The electrolyte includes an electrochromic material containing metal ions and a solvent, the metal ions enable reversible electrodeposition and dissolution, and a metal of the metal ions is different from metal used in the metal film.

Metals in the gel electrolyte are preferably to be non-noble metals, which are more active, especially IB, IIB, IIIA to VA-group metals. These metals have high exchange current density, good reversibility, and can well realize reversible electrodeposition and dissolution.

The surface-modified film is a film with oxygen-containing functional groups functionalized or a transition layer plated on the surface by a plasma treatment to increase the binding force between an inert metal film and the film.

The electrolyte also includes a mediator and an adjuvant to realize reversible electrochemical deposition of the metal and increase the electrical conductivity of the electrolyte.

The electrochromic material containing metal ions includes a salt for electrodeposition of metal ions. The metal ions may be silver, bismuth, copper, tin, cadmium, mercury, indium, lead, antimony, aluminum, zinc, and alloy ions thereof, etc. The electrochromic material containing metal ions may be silver nitrate, silver tetrafluoroborate, silver perchlorate, and copper chloride, etc. The transition between high and low emissivity states of the working electrode is realized through reversible electrodeposition of the metal ions in the electrochromic material.

The mediator is a salt containing metal ions and the potential required for the reduction of the metal ions is lower (more positive) than that required for the reduction of the metal ions in the electrochromic material containing metal ions. The mediator is preferably a copper salt and an iron salt, such as copper chloride, decamethyl ferrocene, decamethyl tetrafluoroborate ferrocenium, or 6-(tri-tert-butylferrocene) hexyl)triethylammonium tetrafluoroborate. This is conducive to charge transfer, so as to make an electrodeposition reaction more reversible.

Preferably, the potential required for the reduction of the metal ions is slightly lower than that required for the reduction of the metal ions in the electrochromic material containing metal ions, preferably within 1 V, to make the electrodeposition reaction more reversible.

The adjuvant is one of a chloride, an iodide, a bromide, a pyridine, and an imidazole, such as tetrabutylammonium bromide, 1-octyl-3-methylimidazole bromide, lithium bromide, 1-butyl-3-methylimidazole nitrate, 1-butyl-3-methylimidazole hexafluorophosphate, 2,2'-bipyridine, 1,10-phenanthroline, or a polyethylene glycol thiourea halide. The adjuvant is added to reduce the rate of the reversible electrodeposition reaction and make the metal deposition denser.

The solvent is one of water, an organic solvent, an ionic liquid, a polyionic liquid, and a eutectic solvent.

Preferably, the flexible polymer film is at least one of polyethylene, polypropylene, polyimide, polyester, polyvinylidene fluoride, polytetrafluoroethylene, polystyrene, and polyvinyl chloride. The selection of an appropriate flexible polymer film not only ensures the flexibility of the final product, but also ensures that the final product has emissivity control of about 0.5 in the whole band of 2.5 to 25 μm (due to the high transparency of the flexible polymer film in the whole infrared band).

Preferably, the transition layer is at least one of an oxide, a nitride, a fluoride, a semiconductor element, and a metal element. The transition layer is used to bond the polymer film and the metal film to improve the cycling stability and uniformity of the device.

Preferably, the oxide is one of $SiO_2$, $Cr_2O_3$, $TiO_2$, $Al_2O_3$, $Fe_2O_3$, ZnO, $HfO_2$, $Ta_2O_5$, and $ZrO_2$; the nitride is $Si_3N_4$; the fluoride is $BaF_2$, $CaF_2$, or $MgF_2$; the semiconductor element is Si or Ge; and the metal element is one of titanium, chromium, and nickel. The selection of an appropriate transition layer makes the device have better performance.

Preferably, the metal in the metal film is one of ruthenium (Ru), rhodium (Rh), palladium (Pd), osmium (Os), iridium (Ir), platinum (Pt), yttrium (Y), zirconium (Zr), niobium (Nb), molybdenum (Mo), technetium (Tc), hafnium (Hf), tantalum (Ta), tungsten (W), rhenium (Re), and gold (Au). Inert precious metal is used as a raw material to improve the stability performance of the device.

Preferably, a thickness of the flexible polymer film is 5 to 100 μm; a thickness of the transition layer is less than 100 nm; a thickness of the metal film is 2 to 30 nm; and a thickness of the gel electrolyteis 10 to 300 The thickness of the flexible polymer film is controlled to make the device flexible. The thickness of the transition layer is controlled to make the device have good variable emissivity performance. The thickness of the metal film is controlled to control the magnitude of sheet resistance of the working electrode and to control a ratio of an absorbed part to a part penetrated by infrared radiation in the working electrode, thereby realizing that the sum of the absorbed part and the part penetrated by infrared radiation in the working electrode in a band of 3.0 to 14.0 μm accounts for more than 50% of the total spectral response of the working electrode within this band. In addition, the thickness of the metal film is controlled to reduce costs. The gel electrolyte layer provides some mechanical support for the whole device, avoids a foaming phenomenon possibly caused by the direct use of a liquid electrolyte, and also can absorb infrared light passing through the working electrode. A distance between the working electrode and the counter electrode is controlled within 10 to 300 μm to make the infrared light passing through the working electrode be completely absorbed by the gel electrolyte layer.

Preferably, sheet resistance of the working electrode is 10 to 400Ω/□. The sheet resistance of the working electrode affects the conductivity of the working electrode, thus affecting internal conductivity of the device.

Preferably, the counter electrode includes a substrate and a conductive layer, and the conductive layer is arranged on an upper side of the substrate. The counter electrode is a commonly used counter electrode, which is easy to obtain and will not be corroded by the electrolyte. The conductive layer is designed to promote electrical conductivity within the device.

The conductive layer is preferably indium tin oxide (ITO), which has excellent conductivity.

Preferably, the substrate is a flexible film to enhance the flexibility of the final device.

Preferably, the porous membrane is a flexible porous material capable of conducting ions, including filter paper, polyethylene, polypropylene, nylon, polyvinylidene fluoride, polysulfone, polyether ether ketone, and polyester. The selection of an appropriate porous membrane does not affect the flexibility of the final product, and promote the flow of the ions.

The present invention further provides a preparation method of a flexible variable emissivity electrochromic device, including the following steps:

S1: A flexible polymer film is surface-modified and/or a transition layer is plated on one side of the film.

S2: A metal film is deposited on one side of the surface-modified flexible polymer film, to obtain a working electrode;

or a metal film is deposited on the transition layer side of the flexible polymer film or the surface-modified flexible polymer film, to obtain a working electrode.

S3: A gel electrolyte is prepared, and a porous membrane is infiltrated with the gel electrolyte to obtain a gel electrolyte layer.

S4: A conductive layer is directly deposited on one side of the substrate, to obtain a counter electrode.

S5: One side of the working electrode obtained in S2 deposited with the metal film is superimposed on one side of the gel electrolyte layer obtained in S3, one side of the counter electrode obtained in S4 deposited with the conductive layer is superimposed on the other side of the gel electrolyte layer obtained in S3, and edges of the superimposed structure are sealed to obtain the variable emissivity electrochromic device based on metal electrodeposition.

Preferably, S1 specifically includes the following steps:

carrying out an oxygen plasma treatment on the flexible polymer film, to obtain a modified film with oxygen-containing functional groups functionalized on a surface;

or directly plating the transition layer with a thickness less than 100 nm on one side of the flexible polymer film;

or first carrying out the oxygen plasma treatment on the flexible polymer film, and then plating the transition layer with the thickness less than 100 nm on one side of the treated film.

S2 specifically includes the following steps:

depositing the metal film on one side of the modified film with oxygen-containing functional groups functionalized on the surface, to obtain the working electrode;

or depositing the metal film on the transition layer side of the flexible polymer film, to obtain the working electrode;

or depositing the metal film on the transition layer side of the modified film with oxygen-containing functional groups functionalized on the surface, to obtain the working electrode.

Preferably, in S5, before assembly, in order to make the electrical contact in the device uniform, a conductive silver paint or a conductive tape is first applied around the working electrode and the counter electrode, and then the conductive silver paint or conductive tape is sealed with epoxy resin and polyimide tapes to prevent direct contact between the conductive silver paint or conductive tape and the gel electrolyte.

The edges of the superimposed structure are sealed with the epoxy resin and polyimide tapes to prevent electrolyte leakage.

Example 1

Figure 2:
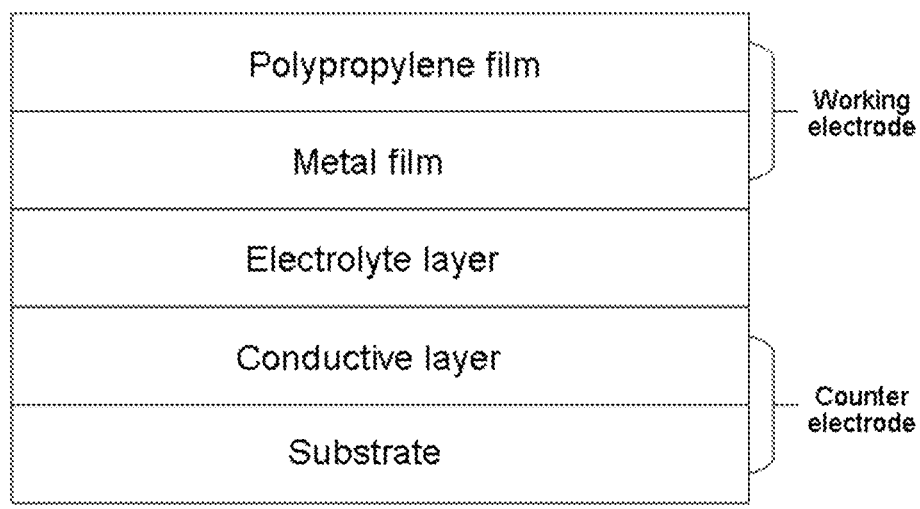
FIG. 2 is a detailed structural diagram of the flexible variable emissivity electrochromic device according to Embodiment 1.

The present embodiment provides a flexible variable emissivity electrochromic device as shown in FIG. 1 and FIG. 2, including a working electrode, a gel electrolyte layer, and a counter electrode sequentially from top to bottom.

The working electrode includes a polypropylene film and a metal film, the polypropylene film is a surface-modified film, and the metal film is deposited on the surface-modified film.

The electrolyte layer includes a porous membrane and an electrolyte, and the electrolyte is infiltrated in the porous membrane. The electrolyte includes an electrochromic material containing metal ions and a solvent, the metal ions enable reversible electrodeposition and dissolution, and a metal of the metal ions is different from metal used in the metal film.

In the present embodiment, the surface of the modified polypropylene film is functionalized with oxygen-containing functional groups, with a thickness of 30 μm; the metal film is a platinum (Pt) film with a thickness of 10 nm; the gel electrolyte in the gel electrolyte layer is made from a mixture of silver nitrate (an electrochromic material containing metal ions), copper chloride (a mediator), tetrabutylammonium bromide (an adjuvant), polyvinyl alcohol (a host polymer), and dimethyl sulphoxide (a solvent), with a thickness of 150 μm.

Figure 3:
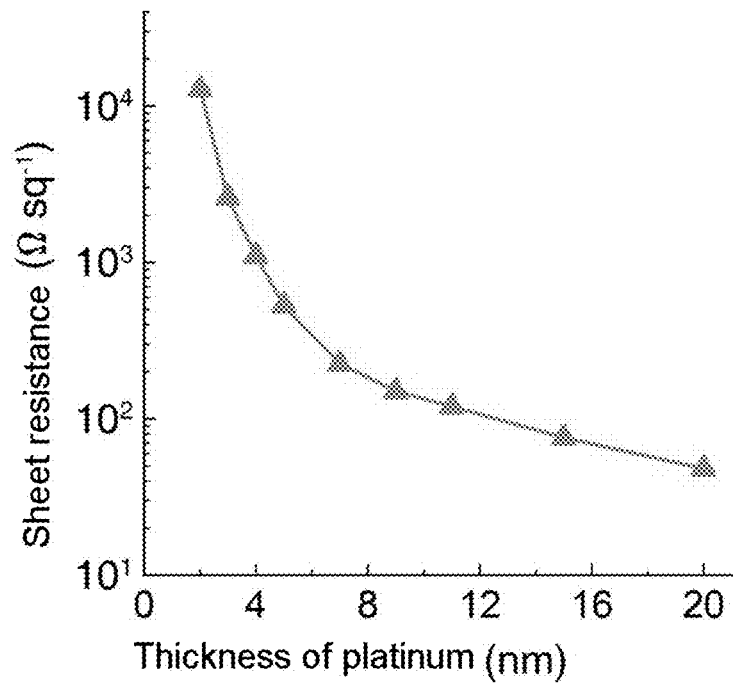
FIG. 3 is a diagram showing a relationship between a thickness of an ultrathin platinum film deposited on a modified polypropylene film and sheet resistance of a working electrode.

FIG. 3 is a diagram showing a relationship between a thickness of an ultrathin platinum film deposited on a modified polypropylene film and sheet resistance of a working electrode. FIG. 3 shows that the value of the sheet resistance of the working electrode decreases with the increase of the thickness of the platinum film. Therefore, an appropriate thickness of the platinum film should be selected to obtain the appropriate sheet resistance of the working electrode. When the thickness of the platinum film is 10 nm, the sheet resistance of the working electrode is 150 Ω/□.

Figure 4A:
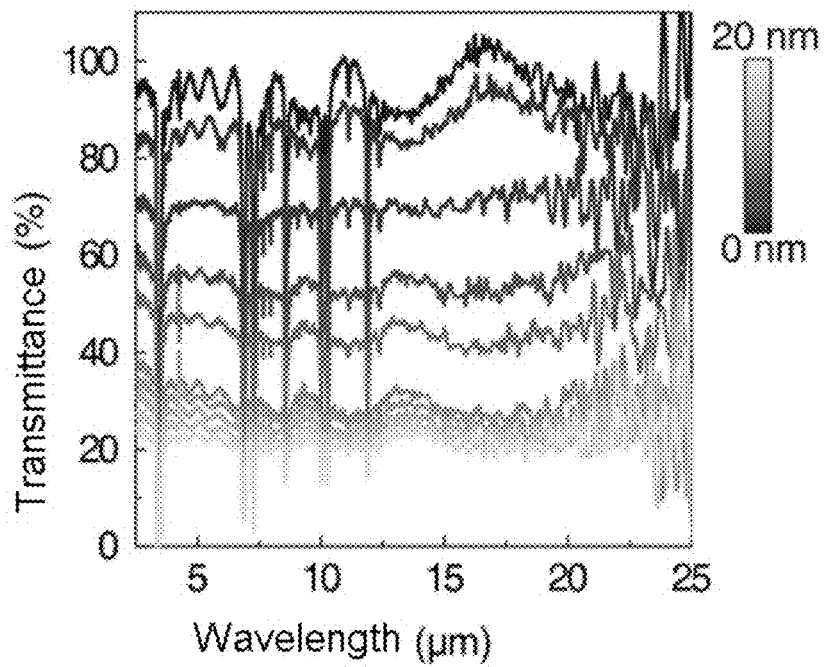
FIG. 4A is a diagram showing a relationship between the thickness of the ultrathin platinum film deposited on the modified polypropylene film and infrared transmittance of the working electrode.

FIG. 4A is a diagram showing a relationship between thickness of the ultrathin platinum film deposited on the modified polypropylene film and infrared transmittance of the working electrode. FIG. 4A shows that the infrared transmittance of the working electrode gradually decreases with the increase of the thickness of the ultrathin platinum film, indicating that the platinum film can play a role in preventing transmission of infrared light.

Figure 4B:
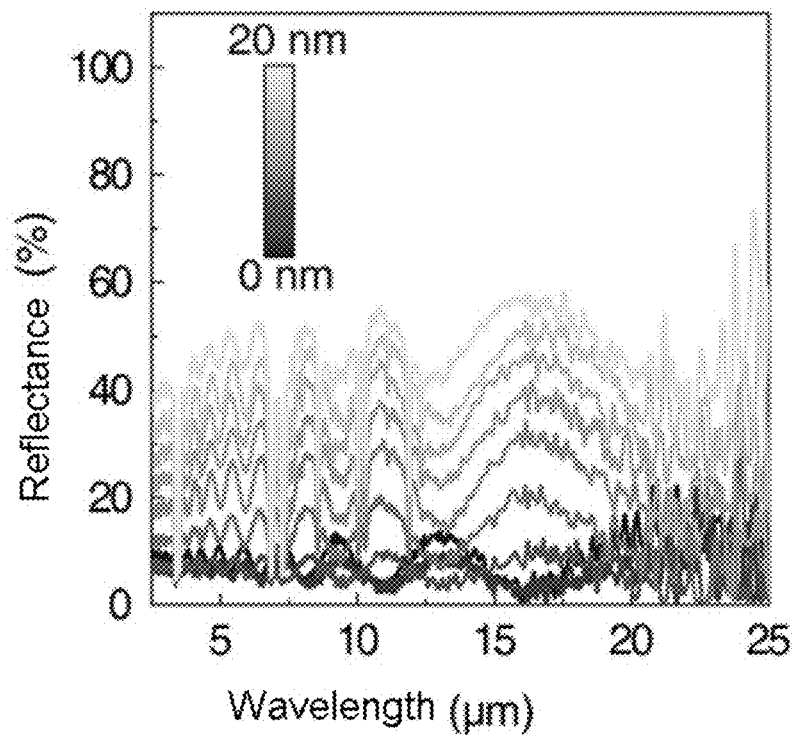
FIG. 4B is a diagram showing a relationship between the thickness of the ultrathin platinum film deposited on the modified polypropylene film and infrared reflectance of the working electrode.

FIG. 4B is a diagram showing a relationship between the thickness of the ultrathin platinum film deposited on the modified polypropylene film and infrared reflectance of the working electrode. FIG. 4B shows that the infrared reflectance of the working electrode gradually increases with the increase of the thickness of the ultrathin platinum film, indicating that the ultrathin platinum film has a function of infrared light reflection.

Figure 4C:
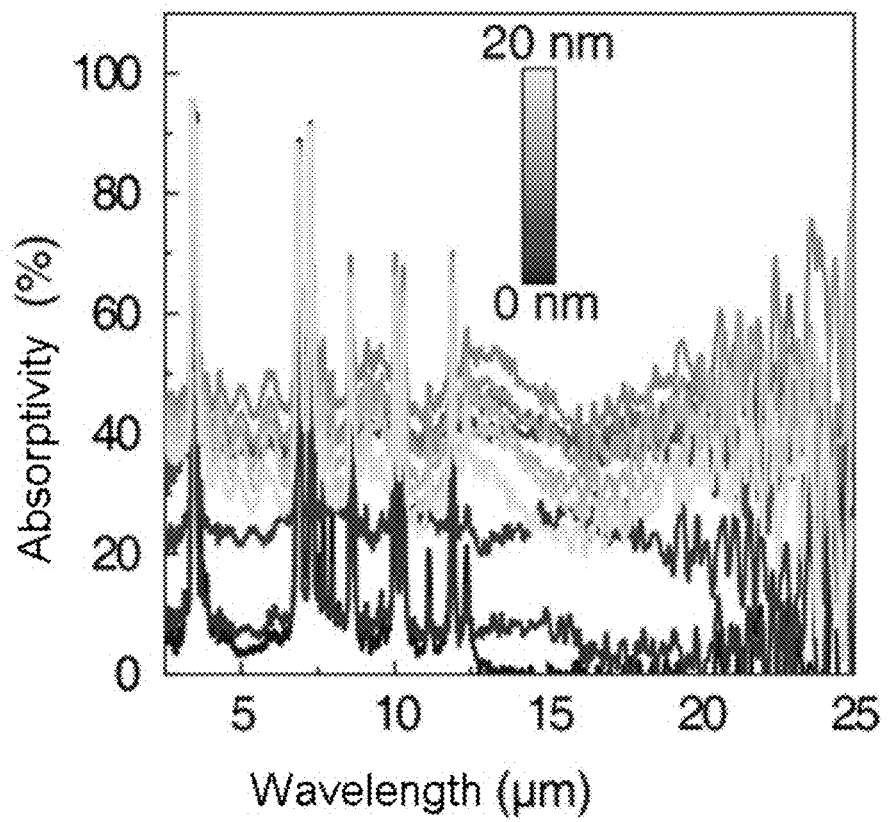
FIG. 4C is a diagram showing a relationship between the thickness of the ultrathin platinum film deposited on the modified polypropylene film and infrared absorptivity of the working electrode.

FIG. 4C is a diagram showing a relationship between the thickness of the ultrathin platinum film deposited on the modified polypropylene film and infrared absorptivity of the working electrode. FIG. 4C shows that the infrared absorptivity of the working electrode first increases and then decreases with the increase of the thickness of the ultrathin platinum film, indicating that the platinum film has a function of absorbing infrared light, and the absorption of infrared light is higher when the thickness of the platinum film is suitable.

Figure 4D:
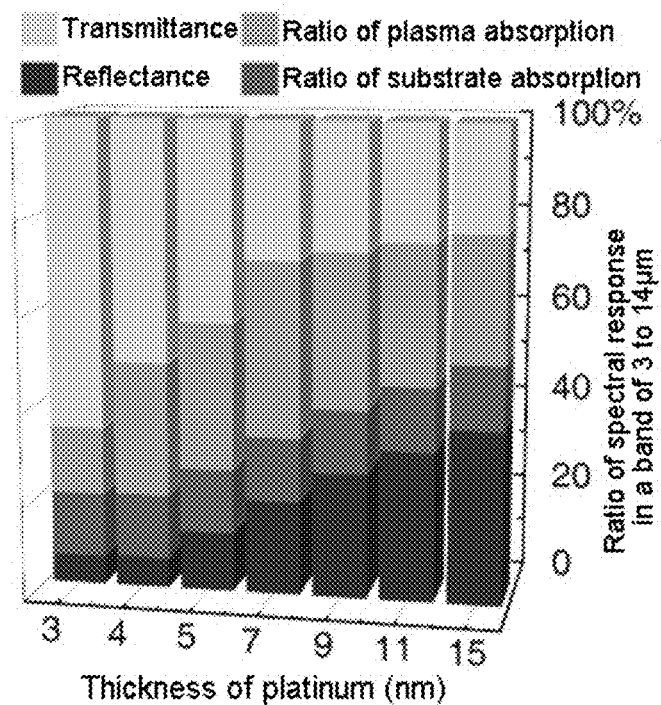
FIG. 4D is a diagram showing a relationship between the thickness of the ultrathin platinum film deposited on the modified polypropylene film and a ratio of average infrared transmittance, average infrared reflectance, average plasma infrared absorption and average modified polypropylene film infrared absorption of the working electrode in a band of 3 to 14 μm to the total spectral response of the working electrode in the band of 3 to 14 μm.

FIG. 4D is a diagram showing a relationship between the thickness of the ultrathin platinum film deposited on the modified polypropylene film and a ratio of average infrared transmittance, average infrared reflectance, average plasma infrared absorption (i.e., infrared absorption of the platinum film) and average modified polypropylene film infrared absorption of the working electrode in a band of 3 to 14 μm to the total spectral response of the working electrode in the band of 3 to 14 FIG. 4D shows that when the thickness of the platinum film is 3 nm, the average infrared transmittance of the working electrode in the band of 3 to 14 μm is very high, while the average infrared reflectance is very low, and the average plasma infrared absorption is also at a low level; with the increase of the thickness of the platinum film, the average infrared transmittance of the working electrode in the band of 3 to 14 μm gradually decreases, while the average infrared reflectance gradually increases, and the average plasma infrared absorption significantly increases. However, the average infrared absorption of the infrared transparent substrate does not change with the increase of the thickness of the platinum film. FIG. 4D shows that the modified polypropylene film substrate has a function of infrared light absorption which is not affected by the platinum film deposited on the surface. Meanwhile, the modified polypropylene film substrate has high infrared transmittance and low infrared reflectance. The platinum film can prevents transmission of the infrared light mainly through infrared light reflection and infrared light absorption.

Figure 5:
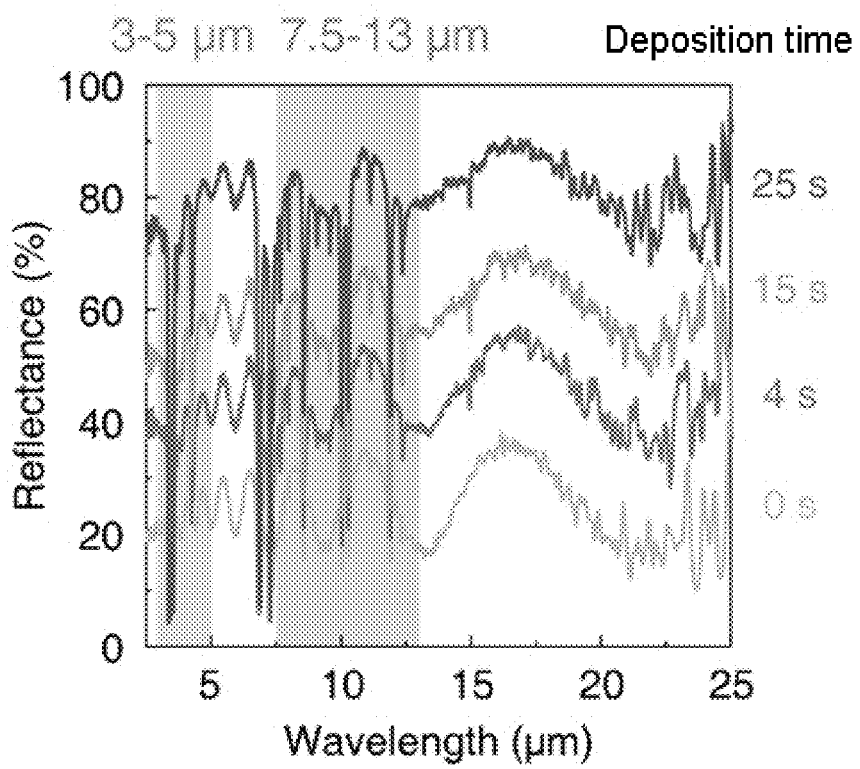
FIG. 5 is an infrared reflectance curve of the flexible variable emissivity electrochromic device according to Example 1, which is measured by Fourier infrared spectrometer with the increase of a deposition time of a metal film in an electrolyte.

FIG. 5 is an infrared reflectance curve of the flexible variable emissivity electrochromic device in the present embodiment, which is measured by Fourier infrared spectrometer with the increase of the deposition time. FIG. 5 shows that the infrared reflectance gradually increases with the increase of deposition time, so as to realize electro gradient adjustment of emissivity.

Figure 6:
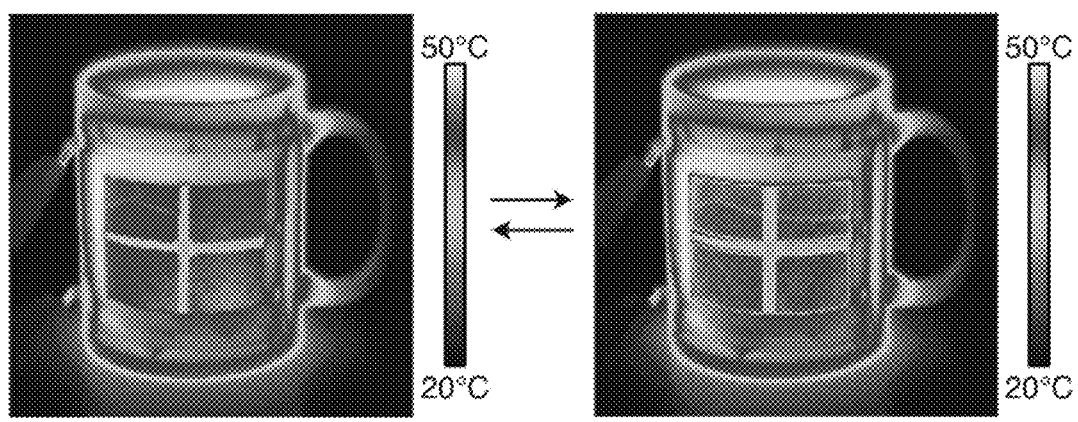
FIG. 6 is a diagram showing thermal imaging of the flexible variable emissivity electrochromic device according to the present embodiment under an infrared camera in a band of 7.5 to 13 μm with the increase of the deposition time of the metal film in the electrolyte when the device is affixed to a curved cup.

FIG. 6 is a diagram showing thermal imaging of the flexible variable emissivity electrochromic device according to the present embodiment under an infrared camera in a band of 7.5 to 13 µm with the increase of the deposition time when the device is affixed to a curved cup. FIG. 6 shows that the flexible variable emissivity electrochromic device can achieve a good electrogenerated variable emissivity on a curved surface.

The present embodiment further provides a preparation method of a flexible variable emissivity electrochromic device, including the following steps:

S1: Oxygen plasma treatment is carried out on a polypropylene film, to obtain a modified polypropylene film with oxygen-containing functional groups functionalized on a surface.

S2: A platinum film is directly deposited on one side of the modified polypropylene film by an electron beam evaporation system to obtain a working electrode.

S3: A gel electrolyte is prepared by heating and stirring 0.5 mmol silver nitrate ($AgNO_3$), 0.1 mmol copper chloride ($CuCl_2$), 2.5 mmol tetrabutylammonium bromide, 5 to 15 wt. % polyvinyl alcohol (MW=89,000 to 98,000) and 100 mL dimethyl sulfoxide, and a gel electrolyte layer is obtained by infiltrating filter paper with the gel electrolyte. The gel electrolyte and silver ions can realize reversible deposition and dissolution.

S4: A counter electrode is prepared by direct deposition of ITO on one side of a poly(ethylene terephthalate) substrate.

S5: One side of the working electrode obtained in S2 deposited with the platinum film is superimposed on one side of the gel electrolyte layer obtained in S3, one side of the counter electrode obtained in S4 deposited with the ITO is superimposed on the other side of the gel electrolyte layer obtained in S3, and edges of the superimposed structure are sealed using epoxy resin and polyimide tapes to obtain the flexible variable emissivity electrochromic device.

Before assembly, in order to make the electrical contact in the device uniform, a conductive silver paint or a conductive tape is first applied around the working electrode and the counter electrode, and then the conductive silver paint or a conductive tape is sealed with the epoxy resin and polyimide tapes to prevent direct contact between the conductive silver paint or conductive tape and the gel electrolyte.

Example 2

The present embodiment provides a flexible variable emissivity electrochromic device, including a working electrode, a gel electrolyte layer, and a counter electrode sequentially from top to bottom.

The working electrode includes a polyester film and a metal film. A transition layer is plated on one side of the polyester film, and the metal film is deposited on the transition layer.

The electrolyte layer includes a porous membrane and an electrolyte, and the electrolyte is infiltrated in the porous membrane. The electrolyte includes an electrochromic material containing metal ions and a solvent, the metal ions enable reversible electrodeposition and dissolution, and a metal of the metal ions is different from that used in the metal film.

In the present embodiment, a thickness of the polyester film is 5 µm; the metal film is a ruthenium (Ru) film with a thickness of 2 nm; the gel electrolyte in the gel electrolyte layer is made from a mixture of silver nitrate (an electrochromic material containing metal ions), decamethyl tetrafluoroborate ferrocenium (a mediator), and 1-butyl-3-methylimidazole nitrate (an adjuvant and a solvent) (the electrolyte is prepared by heating and stirring 0.5 mmol silver nitrate, 0.1 mmol decamethyl tetrafluoroborate ferrocenium and 100 mL 1-butyl-3-methylimidazole nitrate), with a thickness of 10 µm.

In the present embodiment, the sheet resistance of the working electrode is 100 Ω/□.

Example 3

The present embodiment provides a flexible variable emissivity electrochromic device, including a working electrode, a gel electrolyte layer, and a counter electrode sequentially from top to bottom.

The working electrode includes a modified polyvinyl chloride film and a metal film. A transition layer is plated on a lower side of the modified polyvinyl chloride film, and the metal film is deposited on the transition layer.

The electrolyte layer includes a porous membrane and an electrolyte, and the electrolyte is infiltrated in the porous membrane. The electrolyte includes an electrochromic material containing metal ions and a solvent, the metal ions enable reversible electrodeposition and dissolution, and a metal of the metal ions is different from that used in the metal film.

In the present embodiment, the surface of the modified polyvinyl chloride film is functionalized with oxygen-containing functional groups, with a thickness of 100 µm; the metal film is a gold (Au) film with a thickness of 30 nm; the gel electrolyte in the gel electrolyte layer is made from a mixture of silver tetrafluoroborate, decamethyl ferrocene, 1,10-phenanthroline, polyvinyl alcohol, and dimethyl sulfoxide, with a thickness of 300 µm.

In the present embodiment, the sheet resistance of the working electrode is 80 Ω/□.

The above are merely preferred embodiments of the present invention, but do not thus limit the patent scope of the present invention. Any equivalent structural transformation made by using the description and the drawings of the present invention or direct/indirect applications in other related technical fields under the inventive conception of the present invention shall fall within the protection scope of the present invention.

What is claimed is:

1. A flexible variable emissivity infrared electrochromic device, comprising a working electrode, a gel electrolyte layer, and a counter electrode sequentially from top to bottom; wherein
    the working electrode comprises a flexible polymer film and a metal film, the flexible polymer film is a surface-modified film and/or a film with a transition layer plated on a lower side of the film, the metal film is deposited on the surface-modified film or the transition layer; and
    the electrolyte layer comprises a porous membrane and an electrolyte, the electrolyte is infiltrated in the porous membrane; the electrolyte comprises an electrochromic material containing metal ions and a solvent, the metal ions enable a reversible electrodeposition and a dissolution, and a metal of the metal ions is different from a metal used in the metal film; and wherein the metal ions are one or more selected from the group consisting of: Ag, Bi, Cu, Sn, Cd, Hg, In, Pb, Sb, Al and Zn.

2. The flexible variable emissivity infrared electrochromic device according to claim 1, wherein the flexible polymer film is at least one selected from the group consisting of polyethylene, polypropylene, polyimide, polyester, polyvinylidene fluoride, polytetrafluoroethylene, polystyrene, and polyvinyl chloride.

3. The flexible variable emissivity infrared electrochromic device according to claim 1, wherein the transition layer is at least one selected from the group consisting of an oxide, a nitride, a fluoride, a semiconductor element, and a metal element.

4. The flexible variable emissivity infrared electrochromic device according to claim 3, wherein the oxide is one selected from the group consisting of $SiO_2$, $Cr_2O_3$, $TiO_2$, $Al_2O_3$, $Fe_2O_3$, ZnO, $HfO_2$, $Ta_2O_5$, and $ZrO_2$; the nitride is $Si_3N_4$; the fluoride is $BaF_2$, $CaF_2$, or $MgF_2$; the semiconductor element is Si or Ge; and the metal element is one selected from the group consisting of titanium, chromium, and nickel.

5. The flexible variable emissivity infrared electrochromic device according to claim 1, wherein the metal in the metal film is one selected from the group consisting of ruthenium, rhodium, palladium, osmium, iridium, platinum, yttrium, zirconium, niobium, molybdenum, technetium, hafnium, tantalum, tungsten, rhenium, and gold.

6. The flexible variable emissivity infrared electrochromic device according to claim 1, wherein a thickness of the flexible polymer film is 5 to 100 μm; a thickness of the transition layer is less than 100 nm; a thickness of the metal film is 2 to 30 nm; and a thickness of the gel electrolyte layer is 10 to 300 μm.

7. The flexible variable emissivity infrared electrochromic device according to claim 1, wherein a sheet resistance of the working electrode is 10 to 400 Ω/□.

8. The flexible variable emissivity infrared electrochromic device according to claim 1, wherein the counter electrode comprises a substrate and a conductive layer, and the conductive layer is arranged on an upper side of the substrate.

9. The flexible variable emissivity infrared electrochromic device according to claim 8, wherein the substrate is a flexible film.

10. The flexible variable emissivity infrared electrochromic device according to claim 1, wherein the porous membrane is a flexible porous material for conducting ions, and the flexible porous membrane comprises filter paper, polyethylene, polypropylene, nylon, polyvinylidene fluoride, polysulfone, polyether ether ketone, and polyester.

11. A preparation method of a flexible variable emissivity infrared electrochromic device, comprising the following steps:
S1: surface-modifying a flexible polymer film and/or plating a transition layer on one side of the flexible polymer film to obtain a surface-modified flexible polymer film or the flexible polymer film with the transition layer or the surface-modified flexible polymer film with the transition layer;
S2: depositing a metal film on one side of the surface-modified flexible polymer film, to obtain a working electrode;
or
depositing the metal film on a transition layer side of the flexible polymer film or the transition layer side of the surface-modified flexible polymer film, to obtain the working electrode;
S3: preparing a gel electrolyte, and infiltrating a porous membrane with the gel electrolyte to obtain a gel electrolyte layer, the electrolyte layer comprises the porous membrane and the electrolyte, the electrolyte comprises an electrochromic material containing metal ions and a solvent, the metal ions enable a reversible electrodeposition and a dissolution, and a metal of the metal ions is different from a metal used in the metal film and wherein the metal ions are one or more selected from the group consisting of: Ag, Bi, Cu, Sn, Cd, Hg, In, Pb, Sb, Al, and Zn;
S4: directly depositing a conductive layer on one side of a substrate, to obtain a counter electrode; and
S5: superimposing one side of the working electrode obtained in S2 deposited with the metal film on one side of the gel electrolyte layer obtained in S3, and superimposing one side of the counter electrode obtained in S4 deposited with the conductive layer on an other side of the gel electrolyte layer obtained in S3 to obtain a superimposed structure, and sealing edges of the superimposed structure to obtain the variable emissivity infrared electrochromic device based on a metal electrodeposition.

* * * * *